United States Patent
Lee et al.

(10) Patent No.: US 6,448,123 B1
(45) Date of Patent: Sep. 10, 2002

(54) LOW CAPACITANCE ESD PROTECTION DEVICE

(75) Inventors: Jian-Hsing Lee, Hsin-Chu; Kuo-Reay Peng, Tainan; Shih-Chyi Wong, Taichung, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/785,107

(22) Filed: Feb. 20, 2001

(51) Int. Cl.$^7$ .................. H01L 21/8238; H01L 23/62
(52) U.S. Cl. .................................. 438/200; 257/355
(58) Field of Search .................. 438/200; 257/355, 257/356, 357, 358, 359, 360

(56) References Cited

U.S. PATENT DOCUMENTS

| | | | | |
|---|---|---|---|---|
| 5,182,220 A | * | 1/1993 | Ker et al. | 438/200 |
| 5,208,474 A | * | 5/1993 | Yamagata et al. | 257/356 |
| 5,623,156 A | * | 4/1997 | Watt | 257/355 |
| 5,754,380 A | | 5/1998 | Ker et al. | 361/56 |
| 5,754,381 A | | 5/1998 | Ker | 361/56 |
| 5,811,856 A | | 9/1998 | Lee | 257/355 |
| 5,852,315 A | * | 12/1998 | Ker et al. | 257/355 |
| 5,872,379 A | | 2/1999 | Lee | 257/355 |
| 5,874,763 A | * | 2/1999 | Ham | 257/360 |
| 5,898,205 A | | 4/1999 | Lee | 257/355 |
| 6,066,879 A | | 5/2000 | Lee et al. | 257/355 |
| 6,147,538 A | * | 11/2000 | Andresen et al. | 327/309 |
| 6,259,139 B1 | * | 7/2001 | Pan | 257/355 |
| 6,306,695 B1 | * | 10/2001 | Lee et al. | 438/152 |
| 2002/0056876 A1 | * | 5/2002 | Schroeder et al. | 257/355 |

* cited by examiner

*Primary Examiner*—Carl Whitehead, Jr.
*Assistant Examiner*—Toniae M. Thomas
(74) *Attorney, Agent, or Firm*—George O. Saile; Stephen B. Ackerman

(57) ABSTRACT

An ESD protection device for the protection of MOS circuits from high ESD voltages by arranging an N-well of very short length in a P-well or P-substrate. Diffused into this N-well is a P+ diffusion. Together they form a diode and part of a parasitic pnp bipolar transistor which is shared by two parasitic SCRs. The junction capacitance of this N-well is very low and in the order of 0.03 pF. Disposed to either side of this N-well is an NMOS transistor which has its drain (an N+ diffusion) next to the it. The drain and the P+ diffusion are coupled together and connect to a chip pad, which receives the ESD. The chip pad couples to the MOS circuits to be protected. The junction capacitance of both drains combined is in the order of 0.24 pF, so that the junction capacitance of the N-well is about one tenth of that of both drains. A P+ diffusion is located on either side of each source (N+ diffusion) and together are coupled to a reference potential. An ESD pulse applied to the chip pad exceeds the electric field strength of the channel of the NMOS transistors and drives them into conduction and snapback mode. Hole and electron currents between components of the NMOS transistors and the N-well and its P+ diffusion next turn on both SCRs and conduct the ESD current safely from the chip pad to the source and ground.

5 Claims, 4 Drawing Sheets

LOW CAPACITANCE ESD PROTECTION DEVICE

RELATED PATENT APPLICATION

Embedded SCR Protection Device for Output and Input Pad title filing date: Sep. 28, 2000, Ser. No. 09/671214, assigned to a common assignee.

BACKGROUND OF THE INVENTION

1. Field of the Invention

The invention relates to the protection of integrated circuits from electrostatic discharge (ESD), and more particularly to the protection of NMOS transistors by low capacitance ESD protection devices in conjunction with silicone controlled rectifiers (SCRs).

2. Description of the Related Art

The protection of integrated circuits from electrostatic discharge (ESD) is a subject which has received a lot of attention from circuit designers because of the serious damage that ESD can wreak as device dimensions are reduced. Workers in the field and inventors have proposed many solutions, many trying to solve the problem of protecting sub-micron (1 micron=1 $\mu$m =$10^{-6}$ meter) devices while still allowing them to function unencumbered and without undue, or zero, increase of silicon real estate. The main thrust of ESD protection for MOS devices is focused on the snapback breakdown of the NMOS transistor under high field strengths in conjunction with pnp and npn bipolar transistors, which together form a silicon controlled rectifier (SCR). Unwanted as this SCR normally is, it can safely discharge dangerous ESD voltages once triggered by the companion NMOS transistor as long as this trigger voltage is low enough to prevent gate oxide breakdown of the MOS devices which it is designed to protect. With a conventional approach to NMOS design it is hard to design a low capacitance ESD protection device for radio frequency (RF) applications. The below described invention provides a unique solution to ESD protection which has not been proposed in the related art.

U.S. Patents which relate to ESD protection of integrated circuits are:

U.S. Pat. No. 5,872,379 (Lee) describes a low voltage turn-on SCR to provide protection to the input and output circuitry of an integrated circuit during an ESD event.

U.S. Pat. No. 5,811,856 (Lee) discloses an input protection circuit which adds a P+ diffusion adjacent to the emitter of a field device to make the base resistance of each of the field devices approximately equal thus conducting the ESD voltage simultaneously and with equal currents.

U.S. Pat. No. 5,898,205 (Lee) presents an ESD protection circuit which utilizes the insertion of a capacitor in the line between an operating potential bus and the negative power source bus.

U.S. Pat. No. 6,066,879 (Lee) describes an ESD protection circuit which adds a P+ diffusion into the NMOS drain side to build an SCR. A very low snapback voltage of 2 V is achieved.

U.S. Pat. No. 5,753,380 (Ker et al.) provides a modified PTLSCR and NTLSCR for protection of the supply voltage and output pad of an output buffer. The invention requires a smaller layout area than conventional CMOS output buffers with ESD protection.

U.S. Pat. No. 5,753,381 (Ker et al.) is similar to U.S. Pat. No. 5,753,380 above but includes bypass diodes.

It should be noted that none of the above-cited examples of the related art provide for a small protection device and a very low capacitance which could pass a high ESD voltage.

SUMMARY OF THE INVENTION

It is an object of the present invention to provide protection for MOS circuits from high ESD voltages by the use of an ESD protection device which is small by virtue of an inherent low capacitance.

It is another object of the present invention to provide an ESD protection device which is particularly well suited for radio frequency (RF) applications.

These and many other objects have been achieved by arranging for an N-well of very short length in a P-well or P-substrate. Diffused into this N-well is a P+ diffusion. Together they not only form a diode but also form part of a parasitic pnp bipolar transistor which is part of two parasitic SCRs. The junction capacitance of this N-well is very low and in the order of 0.03 pF. Disposed to either side of this N-well is an NMOS transistor which is arranged to have its drain (an N+ diffusion) close to the N-well but without making contact with it. The drain and the P+ diffusion are coupled together and connect to a chip pad, which receives the ESD. The chip pad couples to the MOS circuits to be protected. The junction capacitance of both drains combined is in the order of 0.24 pF, so that the junction capacitance of the N-well is about one tenth of that of both drains. A P+ diffusion, acting as a guard ring, is located on either side of each source (N+ diffusion) and together are coupled to a reference potential (typically ground). An ESD pulse applied to the chip pad exceeds the electric field strength of the channel of the NMOS transistors and drives them into conduction and snapback mode. Hole and electron currents between components of the NMOS transistors and the N-well and its P+ diffusion ultimately turn on both SCRs, triggered via the above mentioned diode, and conduct the ESD current safely from the chip pad to the source and ground. The MOS circuits connected to the chip pad are thus protected from dangerous ESD voltages.

These and many other objects and advantages of the present invention will be readily apparent to one skilled in the art to which the invention pertains from a perusal of the claims, the appended drawings, and the following detailed description of the preferred embodiments.

Note that the figures herein illustrate vertical cross sections of devices and that the devices extend laterally (into and/or out of the page) in a manner appreciated by those skilled in the art.

DESCRIPTION OF THE PREFERRED EMBODIMENT

Figure 1:
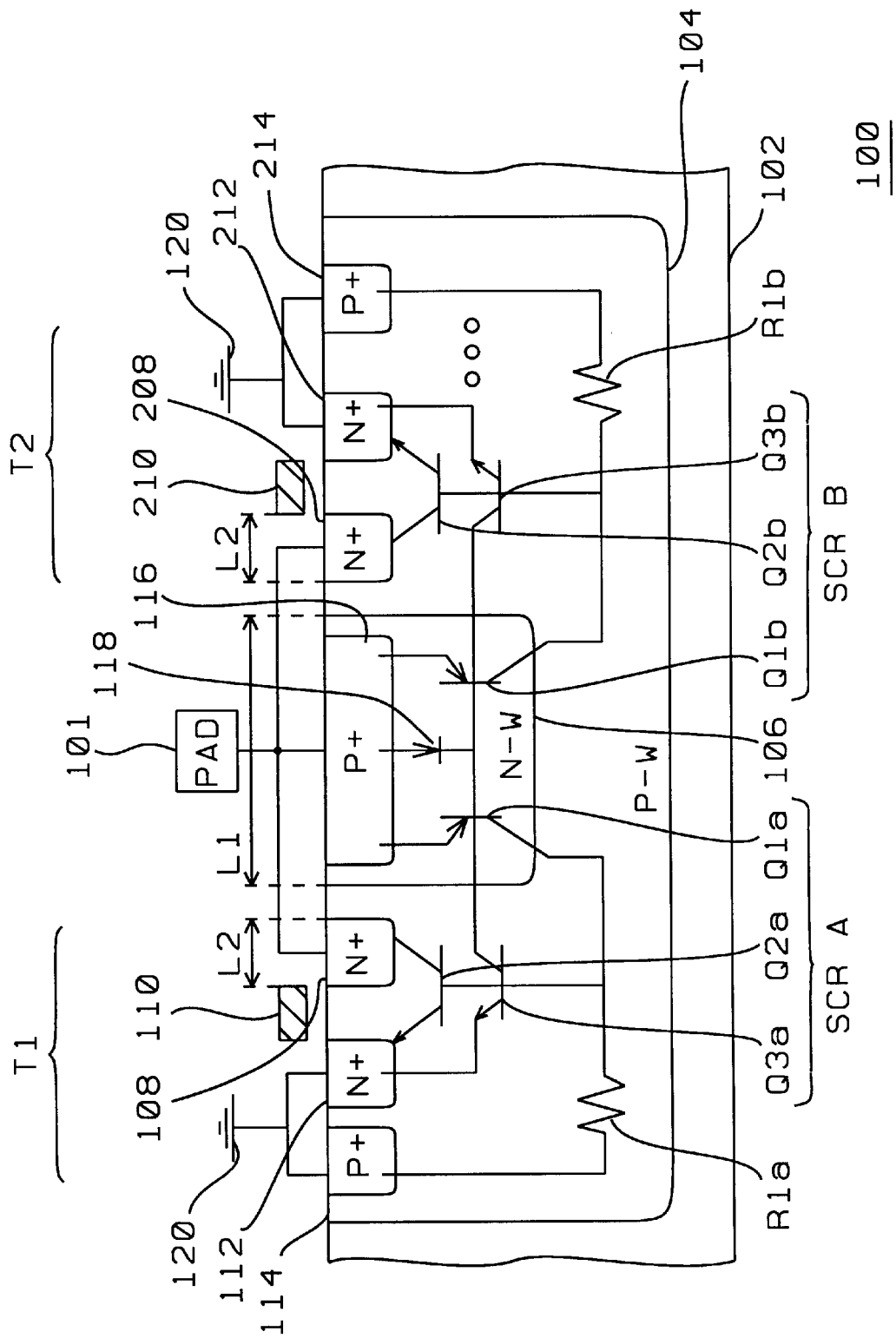
FIG. 1 is a schematic cross-sectional view of the low capacitance ESD protection device of the present invention.
Figure 2:
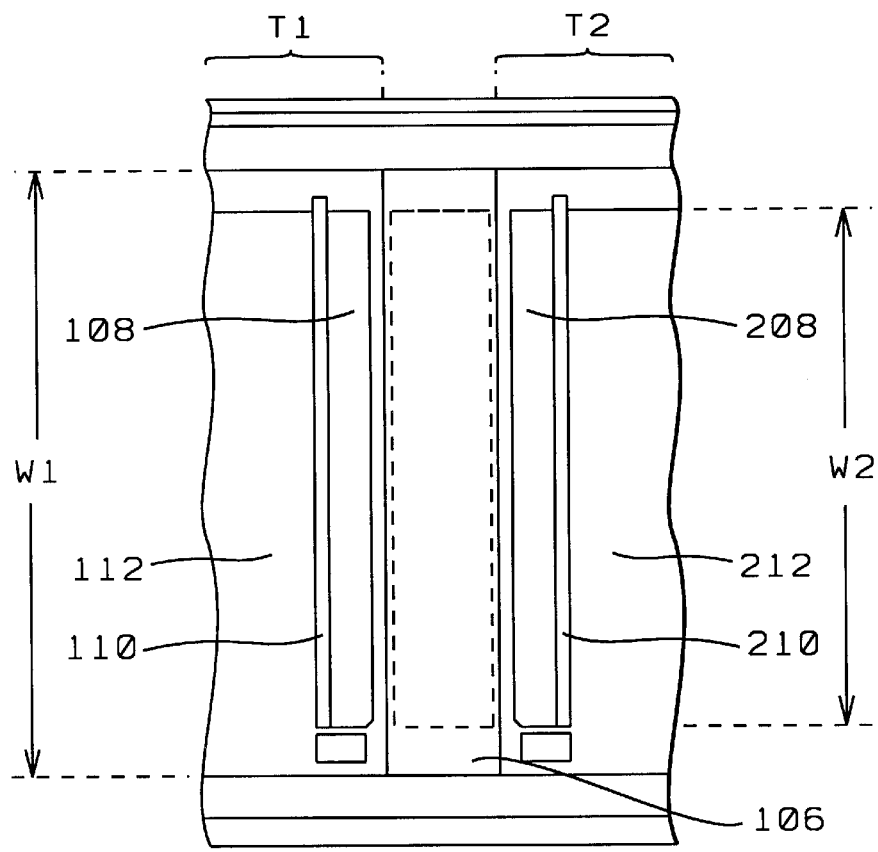
FIG. 2 is a top view layout of the NMOS+SCR protection device of FIG. 1.

Referring now to FIG. 1, we describe the structure of the electrostatic discharge (ESD) protection device 100 of the preferred embodiment of the present invention, which is particularly suited as a protection device for radio frequency (RF) applications because of its small size. A circuit pad 101 receives an ESD pulse and couples it into protection device 100 which is deposited into a semiconductor 102 wafer having a P-well or P-substrate 104. First and a second NMOS transistors T1, T2, respectively, are symmetrically arranged around an N-well 106 such that the first and second N+ diffusion drains 108, 208, respectively, face the N well but are separated from it by the intervening P-well or P-substrate. N-well 106 is quite small having a junction capacitance of less than (0.035) pF. This junction capacitance is much smaller than the combined junction capacitance of the first and second N+ diffusion drains which is typically 0.24 pF but ranges from 0.1 pF to 100 pF. N-well 106 has a preferred length L1 of 4.32 $\mu$m and width W1 of 34 $\mu$m, but the length L1 may range from 0.5 $\mu$m to 20 $\mu$m, and the width W1 may range from 1 $\mu$m to 100 $\mu$m. The N+ diffusion drains 108, 208 each have a preferred length L2 of 2.34 $\mu$m and width W2 of 30 $\mu$m, but the length L2 may range from 0.1 $\mu$m to 10 $\mu$m, and the width W2 may range from 1 $\mu$m to 100 $\mu$m. FIG. 2 is a top view of a portion of FIG. 1 defining the width of the N-well and the drain and source N+ diffusions. The same numerals in FIG. 2 and FIG. 1 designate the same component.

The area and junction capacitances of the N+ diffusion drains and N-well based on the preferred dimensions are:

N+/PW=2.34×30×2=140.4 $\mu m^2 \approx$ 0.24 pF (multiplier 2 is for two drains)

NW/PW=4.32×34=146.88 $\mu m^2$ 0.03 pF total capacitance≈0.27 pF where PW stands for P-well or P-substrate and NW stands for N-well. Clearly the N-well junction capacitance is much less than the N+ junction capacitance.

Continuing with FIG. 1, the first NMOS transistor T1 further comprises gate 110 and third N+ diffusion source 112. The second NMOS transistor T2 further comprises gate 210 and fourth N+ diffusion source 212. A first P+ diffusion 114 is disposed in close proximity to the source 112. A second P+ diffusion 214 is disposed on the other side of source 212. First and second P+ diffusions 114, 214 together act as a guard ring for first and second NMOS transistors T1, T2 and N-well 106. A third P+ diffusion 116 is disposed in N-well 106 and together form diode 118. First and second N+ diffusions drains 108, 208 and third P+ diffusion 116 are coupled to circuit pad 101. Third and fourth N+ diffusion sources and first and second P+ diffusions are coupled to a reference potential 120.

A plurality of protection devices as described above, namely the NMOS transistors T1 and T2 and N-well 106, including P+ diffusion, i.e., everything from N+ diffusion source 112 to and including N+ diffusion source 212 may be disposed between the source 212 of the second NMOS transistor T2 and the second P+ diffusion 214.

Third P+ diffusion 116, N-well 106 and P-well/P-substrate 104 form part of a parasitic silicon controlled rectifier (SCR) structure. For the sake of clarity, this SCR can be thought of consisting of two identical SCRs A and B, and will subsequently be described in this manner. The function of first SCR A is to provide a first current path for the ESD voltage from chip pad 101 to the source 112 of the first NMOS transistor T1, and similarly, the second SCR provides a second current path for the ESD voltage from chip pad 101 to the source 212 of the second NMOS transistor T2. By splitting the current path the current handling capacity of the protection circuit is doubled.

The first parasitic SCR A is connected between the third P+ diffusion 116 and the third N+ diffusion source 112, and further comprises:

a first parasitic pnp transistor Q1$a$ having an emitter, a base, and a collector, where the emitter is the third P+ diffusion 116, the base is the N-well, and the collector is the P-well or P-substrate, a first parasitic npn transistor Q2$a$ having an emitter, a base, and a collector, where the emitter and the collector are the source and drain of the first NMOS transistor T1, respectively, and the base is the P-well or P-substrate, a second parasitic npn transistor Q3$a$ having an emitter, a base, and a collector, where the emitter is the source of the first NMOS transistor T1, the collector is the N-well, and the base is the P-well or P-substrate, and a first bulk resistor R1$a$ connected between the N-well and the first P+ diffusion 114.

The second parasitic SCR B is connected between the third P+ diffusion 116 and the fourth N+ diffusion 212, and further comprises:

a first parasitic pnp transistor Q1$b$ connected just like transistor Q1$a$, a first parasitic npn transistor Q2$b$ having an emitter, a base, and a collector, where the emitter and the collector are the source and the drain of the second NMOS transistor T2, respectively, and the base is the P-well or P-substrate, a second parasitic npn transistor Q3$b$ having an emitter, a base, and a collector, wherein the emitter is the source of the second NMOS transistor T2, the collector is the N-well, and the base is the P-well or P-substrate, and a second bulk resistor R1$b$ connected between the N-well and the second P+ diffusion 214.

When an ESD event occurs the following events happen:

a breakdown in the NMOS transistors occurs because the maximum electric field $E_M$ is exceeded and the electrons in the channel become "hot electrons", as a result hole currents (electron-hole pairs) are generated in the P-well or P-substrate, the hole current causes npn parasitic transistors Q2$a$ and Q2$b$ to turn on, electrons of the electron-hole pairs are injected into the N-well, and are collected by the P+ diffusion 116, which generates a potential from the P+ diffusion to the N-well, forward biasing diode 118 and turning on parasitic pnp transistors Q1$a$ and Q1$b$, the SCRs turn on and current flows.

Figure 3:
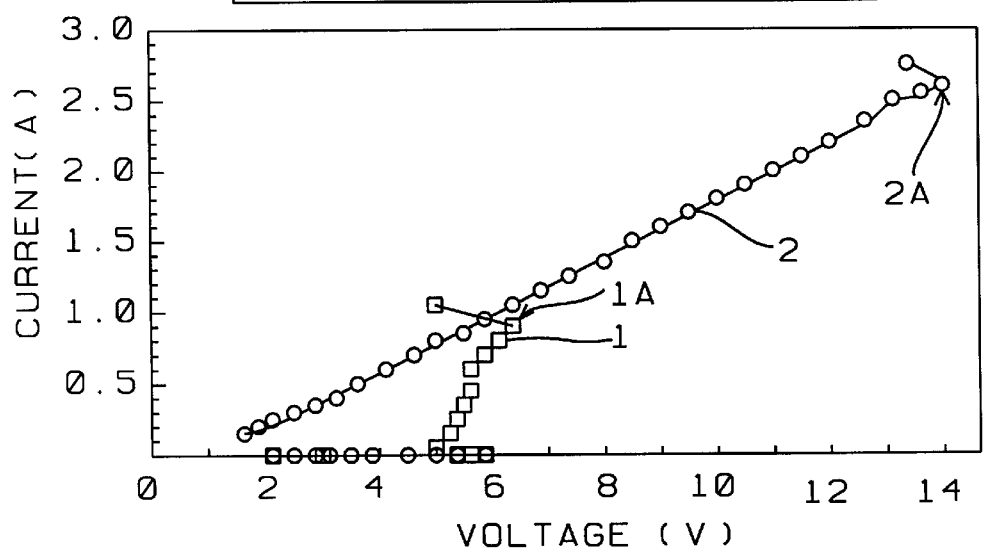
FIG. 3 is graph of NMOS and NMOS+SCR I–V characteristics of the invention.

FIG. 3 is a graph of the response of an NMOS transistor (Curve 1, squares) and of an NMOS transistor with an SCR (Curve 2, circles) under a 100 ns (ns=nano-second) square wave current pulse (a transmission line pulse), i.e., the present invention where pad 112 is attached to drains 108, 208. In addition, gates 110, 210 of NMOS transistors T1, T2 are coupled to the source or reference potential 120. The horizontal axis ranges from 0 to 15 V and the vertical axis ranges from 0 to 3 A. The drain and source of the NMOS transistor (Curve 1) together have a total width of 120 $\mu$m, whereas the drain and source of the NMOS transistor plus SCR (Curve 2) together have a total width of 60 $\mu$m. The maximum current IT-2 before burn-out of the NMOS+SCR (60 $\mu$m) occurs at 2.55 A and about 14 V, Point 2A, while the maximum current IT-2 before burn-out of the NMOS (120 $\mu$m) occurs at 960 mA and approximately 7.5 V, Point 1A. IT-2 correlates to the human body model (HBM) ESD voltage:

HBM ESD voltage≈IT-2×(1.5 k to 2 k)

for IT-2=1 A, the HBM passing voltage is ≅1.5 kV to 2 kV this is because HBM connects to the device using a 1.5 kΩ resistor, while the IT-2 measurement is based on a square wave current pulse and connects to the device directly.

Figure 4:
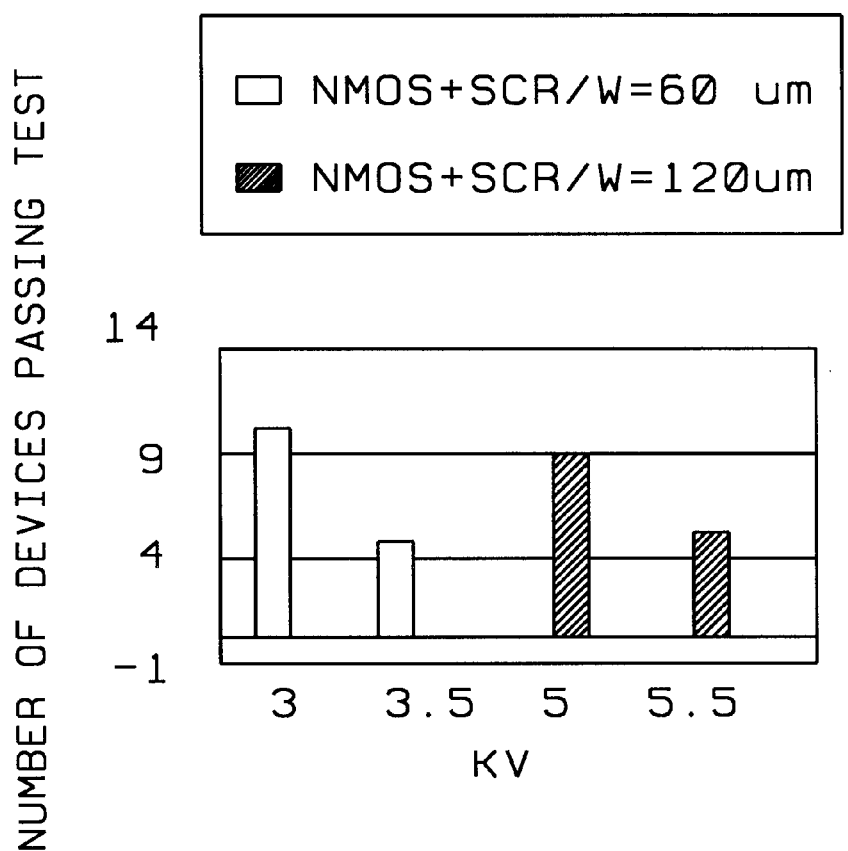
FIG. 4 is a histogram of the number of devices of the invention which passed the test vs. the applied ESD voltage.

FIG. 4 is a histogram of the HBM test results. The horizontal axis lists the voltages in kV at which the tests were conducted and the vertical axis lists the number of devices which passed the test. White bars identify NMOS transistors plus SCR protection devices where each transistor has a total width of 60 μm (drain and source), while black bars identify NMOS transistors plus SCR protection devices where each transistor has a total width of 120 μm (drain and source). It is apparent from the inspection of FIG. 4 that the ESD protection capability of the SCR is proportional to its total width. The above described protection device can safely withstand an ESD voltage ranging from 3 kV (10 devices passed) to 3.5 kV (5 devices passed) when the combined width W2 of a source and a drain of each transistor (source 108 +drain 112 of T1, source 208 +drain212 of T2) is nominally 60 μm but may range from 15 μm to 60 μm. Similarly, the protection device can safely withstand an ESD voltage ranging from 5 kV (9 devices passed) to 5.5 kV (6 devices passed) when the combined width W2 of a source and a drain of each transistor (source 108 +drain 112 of T1, source 208 +drain212 of T2) is doubled to 2×W2, i.e., the total width is nominally 120 μm but may range from 60 μm to 120 μm (a linear extrapolation of the black bars of FIG. 4 shows that 3 devices still would pass the test at 6 kV). Again, refer to FIG. 2 for the definition of the width of the N-well and of the sources and drains of both NMOS transistors.

Figure 5:
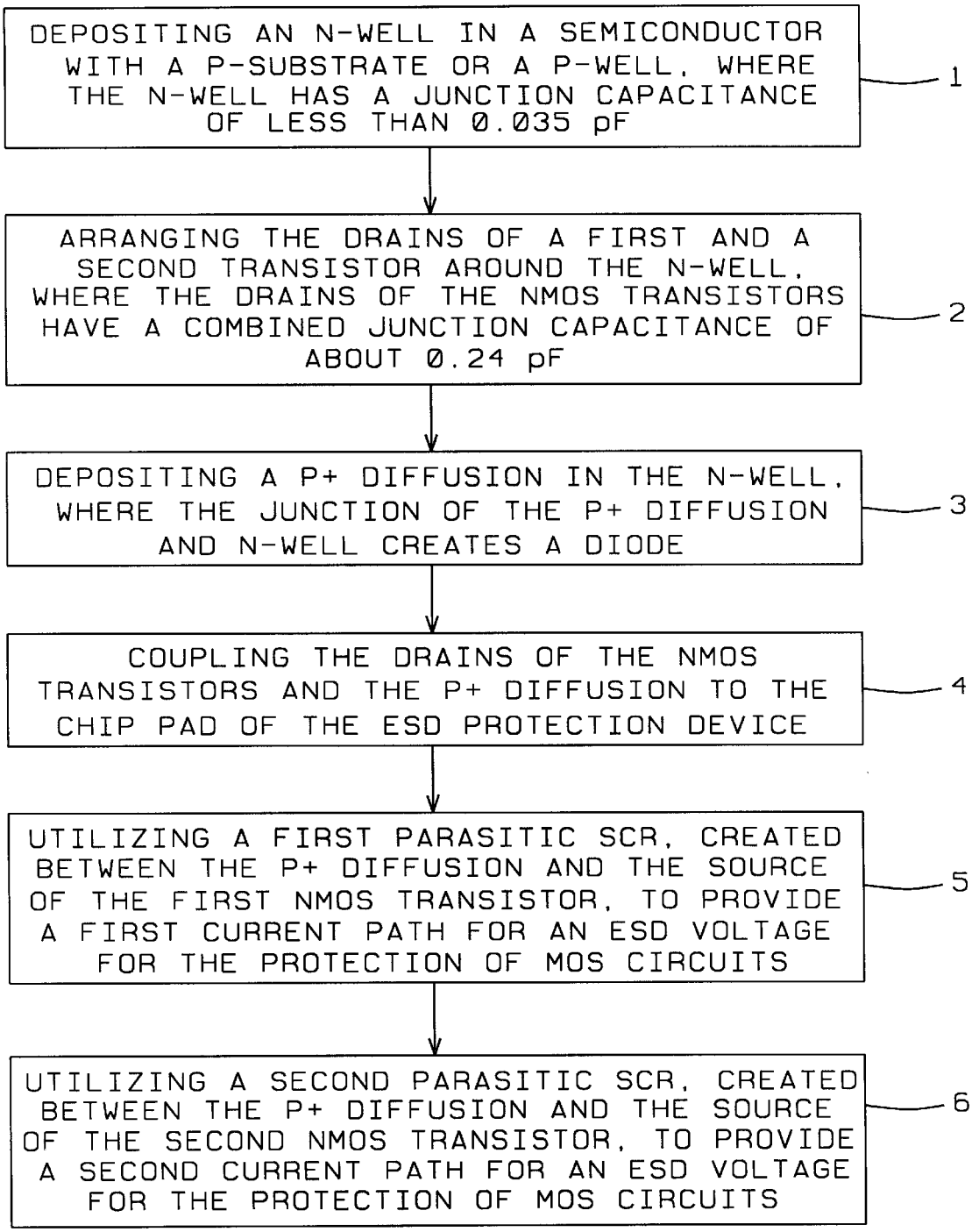
FIG. 5 is a block diagram of the method of the present invention.

We now discuss the method of this invention by reference to FIG. 5:

BLOCK 1 shows depositing of an N-well in a semiconductor with a P-substrate or P-well, where the N-well has a junction capacitance of less than 0.035 pF.

BLOCK 2 arranges the drains of a first and a second NMOS transistor around the N-well, where the drains of the NMOS transistors have a combined junction capacitance of about 0.24 pF.

BLOCK 3 shows the depositing of a P+ diffusion in the N-well, where the junction of the P+ diffusion and N-well creates a diode.

BLOCK 4 shows coupling the drains of the NMOS transistors and the P+ diffusion to the chip pad of the ESD protection device.

BLOCK 5 utilizes a first parasitic SCR, created between the P+ diffusion and the source of the first NMOS transistor, to provide a first current path for an ESD voltage for the protection of MOS circuits.

BLOCK 6 utilizes a second parasitic SCR, created between the P+ diffusion and the source of the second NMOS transistor, to provide a second current path for an ESD voltage for the protection of MOS circuits.

Note that the junction capacitance of the N-well is on the order of one tenth of the junction capacitance of the combined capacitance of the drains of the two NMOS transistors. The much lower junction capacitance of the N-well contributes to the quick turning on of the parasitic SCRs, because correspondingly less time is required to charge up that junction capacitor. The very small dimensions of the N-well further contribute to its much lower junction capacitance. In summary, the above described device and method allows very efficient protection from high ESD voltages using small protection devices which is particularly well suit for RF applications.

While the invention has been particularly shown and described with reference to the preferred embodiments thereof, it will be understood by those skilled in the art that various changes in form and details may be made without departing from the spirit and scope of the invention.

What is claimed is:

1. A method of providing a low capacitance electrostatic discharge (ESD) protection device, comprising the steps of:

providing a semiconductor having a P-substrate;

depositing an N-well in said semiconductor, where said N-well has a junction capacitance of less than 0.035 pF;

providing a first and a second NMOS transistor on either side of said N-well;

arranging the drains of said NMOS transistors around said N-well, the drains of said NMOS transistors having a combined junction capacitance ranging from 0.1 pF to 1 pF;

surrounding said first and said second NMOS transistor and said N-well with a P+ type guard ring;

depositing a P+ diffusion in said N-well, the junction of said P+ diffusion and said N-well creating a diode;

coupling the drains of said NMOS transistors and said P+ diffusion to the chip pad of said ESD protection device;

coupling the sources of said NMOS transistors and said guard ring to a reference potential;

utilizing a first parasitic SCR, created between said P+ diffusion and the source of said first NMOS transistor, to provide a first current path for said ESD voltage for the ESD protection of a MOS circuit; and utilizing a second parasitic SCR, created between said P+ diffusion and the source of said second NMOS transistor, to provide a second current path for said ESD voltage for the ESD protection of said MOS circuit.

2. The method of claim 1, wherein said N-well is separated from said first and said second N+ diffusion by said P-substrate.

3. The method of claim 1, wherein MOS circuits are protected from ESD voltages up to 3.5 kV when the combined width of the drain and source of each of said first and said second NMOS transistor ranges from 15 μm to 60 μm (1 μm=$10^{-6}$ m).

4. The method of claim 1, wherein MOS circuits are protected from ESD voltages up to 6 kV when the combined width of the drain and source of each of said first and said second NMOS transistor ranges from 60 μm to 120 μm.

5. The method of claim 1, wherein said first and said second SCR each can conduct a current of up to 2.55 A.

* * * * *